(12) United States Patent  (10) Patent No.: US 8,163,600 B2
Chow et al.  (45) Date of Patent: Apr. 24, 2012

(54) BRIDGE STACK INTEGRATED CIRCUIT PACKAGE-ON-PACKAGE SYSTEM

(75) Inventors: Seng Guan Chow, Singapore (SG); Il Kwon Shim, Singapore (SG); Byung Joon Han, Singapore (SG)

(73) Assignee: Stats Chippac Ltd., Singapore (SG)

( * ) Notice: Subject to any disclaimer, the term of this patent is extended or adjusted under 35 U.S.C. 154(b) by 671 days.

(21) Appl. No.: 11/616,878

(22) Filed: Dec. 28, 2006

(65) Prior Publication Data
US 2008/0157318 A1  Jul. 3, 2008

(51) Int. Cl.
H01L 21/44 (2006.01)
(52) U.S. Cl. .............. 438/109; 257/E25.006; 257/686
(58) Field of Classification Search .......... 438/107–110, 438/117; 257/E25.006, E25.013, 685–686, 257/723, 726, 777–778
See application file for complete search history.

(56) References Cited

U.S. PATENT DOCUMENTS

| | | | |
|---|---|---|---|
| 5,579,207 A | 11/1996 | Hayden et al. |
| 5,748,452 A | 5/1998 | Londa |
| 5,854,507 A | 12/1998 | Miremadi et al. |
| 5,903,049 A | 5/1999 | Mori |
| 5,907,903 A | 6/1999 | Ameen et al. |
| 5,963,430 A | 10/1999 | Londa |
| 6,101,100 A | 8/2000 | Londa |
| 6,239,496 B1 | 5/2001 | Asada |
| 6,388,333 B1 | 5/2002 | Taniguchi et al. |
| 6,410,983 B1 | 6/2002 | Moriizumi et al. |
| 6,433,412 B2 | 8/2002 | Ando et al. |
| 6,518,659 B1 | 2/2003 | Glenn |
| 6,605,875 B2 | 8/2003 | Eskildsen |
| 6,667,544 B1 | 12/2003 | Glenn |
| 6,731,009 B1 | 5/2004 | Jones et al. |
| 6,740,980 B2 | 5/2004 | Hirose |
| 6,798,057 B2 | 9/2004 | Bolkin et al. |
| 6,853,064 B2 | 2/2005 | Bolken et al. |
| 6,897,553 B2 | 5/2005 | King et al. |
| 6,899,534 B2 | 5/2005 | Tandy |
| 7,061,087 B2 | 6/2006 | Kim |
| 7,075,188 B2 | 7/2006 | Kato et al. |
| 7,087,989 B2 | 8/2006 | Nakayama |
| 7,091,581 B1 | 8/2006 | McLellan et al. |
| 7,095,104 B2 | 8/2006 | Blackshear |
| 7,230,329 B2 * | 6/2007 | Sawamoto et al. ........... 257/686 |
| 7,312,519 B2 | 12/2007 | Song et al. |
| 7,420,269 B2 | 9/2008 | Ha et al. |
| 7,427,535 B2 * | 9/2008 | Vaiyapuri ..................... 438/109 |
| 2004/0021230 A1 | 2/2004 | Tsai et al. |
| 2004/0026789 A1 | 2/2004 | Michii |
| 2004/0036182 A1 | 2/2004 | Corisis et al. |
| 2004/0195700 A1 | 10/2004 | Liu |
| 2006/0139902 A1 | 6/2006 | Happoya |
| 2007/0241442 A1 | 10/2007 | Ha et al. |
| 2008/0029858 A1 | 2/2008 | Merilo et al. |
| 2008/0136006 A1 | 6/2008 | Jang et al. |
| 2008/0136007 A1 | 6/2008 | Kim et al. |

FOREIGN PATENT DOCUMENTS

| | | |
|---|---|---|
| JP | 08222692 | 8/1996 |
| JP | 2001044362 | 2/2001 |
| JP | 2005101132 | 4/2005 |

* cited by examiner

*Primary Examiner* — Hoa B Trinh
(74) *Attorney, Agent, or Firm* — Mikio Ishimaru

(57) ABSTRACT

A bridge stack integrated circuit package-on-package system is provided including forming a first integrated circuit package system having a first substrate, forming a second integrated circuit package system having a second substrate, and mounting a bridge integrated circuit package system on the first substrate and on the second substrate.

14 Claims, 9 Drawing Sheets

BRIDGE STACK INTEGRATED CIRCUIT PACKAGE-ON-PACKAGE SYSTEM

CROSS-REFERENCE TO RELATED APPLICATIONS

The present application contains subject matter related to U.S. patent application Ser. No. 11/383,403, now U.S. Pat. No. 7,518,224. The related application is assigned to STATS ChipPAC Ltd.

The present application also contains subject matter related to U.S. patent application Ser. No. 11/383,407, now U.S. Pat. No. 7,746,656. The related application is assigned to STATS ChipPAC Ltd.

TECHNICAL FIELD

The present invention relates generally to integrated circuit packages and more particularly to integrated circuit package-on-package system.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a printed circuit board substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, the individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. The substrate and integrated circuit are often damaged during assembly or testing, complicating the manufacturing process and increasing costs. The vertically stacked integrated circuit problems can be greater than the benefits.

In addition, multi-chip packages generally provide higher density of integrated circuits but present yet other challenges. Additional structures, such as printed circuit boards, interposers, or flexible wiring, must be currently used to connect the integrated circuits in the multi-chip package. These additional structures add cost, manufacturing complexity, potential failure areas, and potential reliability problems.

Thus, a need still remains for a bridge stack integrated circuit package-on-package system providing low cost manufacturing, improved yield, and decreased size for the integrated circuit package system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a bridge stack integrated circuit package-on-package system including forming a first integrated circuit package system having a first substrate, forming a second integrated circuit package system having a second substrate, and mounting a bridge integrated circuit package system on the first substrate and on the second substrate.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
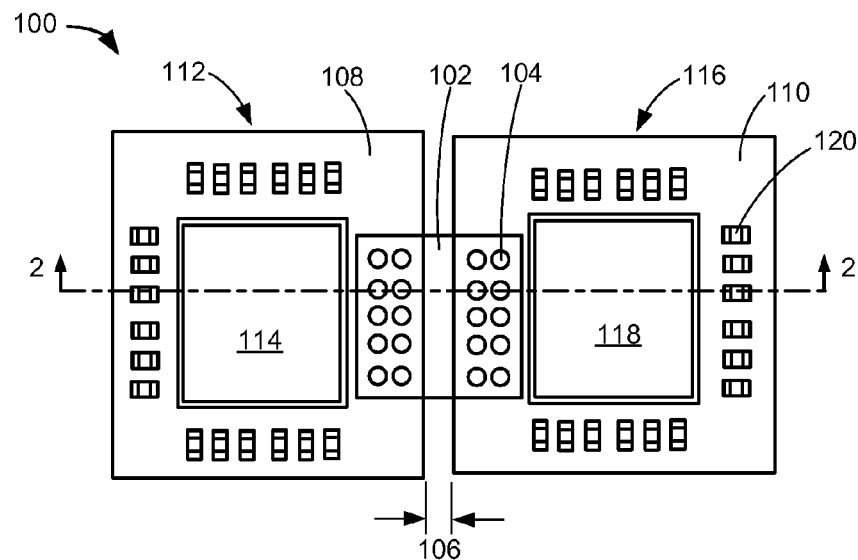
FIG. 1 is a plan view of a bridge stack integrated circuit package-on-package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of a bridge stack integrated circuit package-on-package system 100 in an embodiment of the present invention. The plan view depicts a bridge integrated circuit package system 102 having bridge interconnects 104, such as solder balls, solder paste, or conductive adhesive. The bridge integrated circuit package system 102 functions as a bridge over a separation 106 between a first substrate 108, such as a laminate substrate, a lead frame, a printed circuit board, or a carrier, and a second substrate 110, such as a laminate substrate, a lead frame, a printed circuit board, or a carrier.

A first integrated circuit package system 112, such as an integrated circuit package system, includes a first encapsulation 114, such as an epoxy mold compound or glob top, over the first substrate 108. A second integrated circuit package system 116, such as an integrated circuit package system, includes the second substrate 110 and a second encapsulation 118, such as an epoxy mold compound or glob top, over the second substrate 110. Components 120, such as discrete passive components, are over the first substrate 108 and the second substrate 110.

For illustrative purposes, the components 120 are shown on the first substrate 108 and the second substrate 110, although it is understood that other devices, such as integrated circuits, may also be over the first substrate 108 and the second substrate 110. Also for illustrative purposes, the components 120 are shown substantially the same over the first substrate 108 and the second substrate 110, although it is understood that the components 120 may be different over the first substrate 108 and the second substrate 110.

Figure 2:
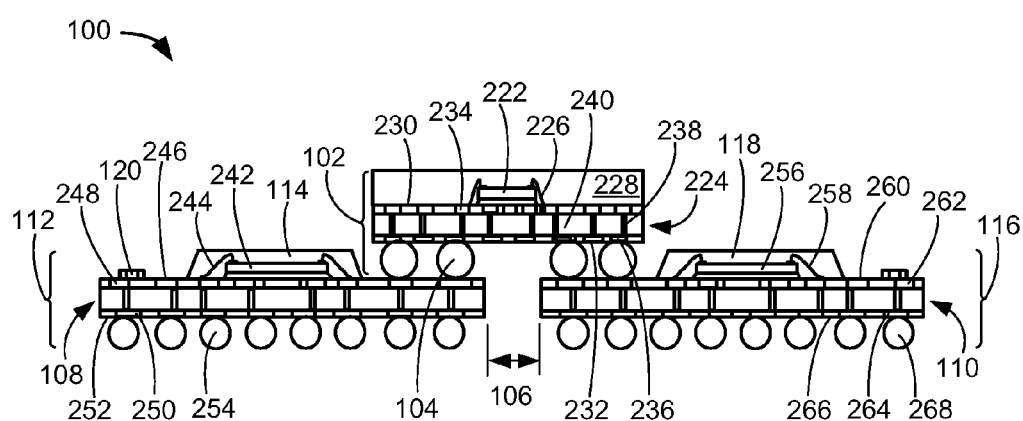
FIG. 2 is a cross-sectional view of the bridge stack integrated circuit package-on-package system along a line segment 2-2 of FIG. 1.

Referring now to FIG. 2, therein is shown a cross-sectional view of the bridge stack integrated circuit package-on-package system 100 along a line segment 2—2 of FIG. 1. The cross-sectional view depicts the bridge integrated circuit package system 102 connecting the first substrate 108 of the first integrated circuit package system 112 and the second substrate 110 of the second integrated circuit package system 116. The bridge integrated circuit package system 102 is over the separation 106 between the first integrated circuit package system 112 and the second integrated circuit package system 116.

The bridge integrated circuit package system 102 has a bridge integrated circuit die 222 over a bridge substrate 224, such as a laminate substrate. Internal interconnects 226, such as bond wires, connect the bridge integrated circuit die 222 and the bridge substrate 224. A package encapsulation 228, such as an epoxy mold compound, over a bridge top surface 230 of the bridge substrate 224 covers the bridge integrated circuit die 222 and the internal interconnects 226. The bridge interconnects 104 attach to a bridge bottom surface 232 of the bridge substrate 224. For illustrative purposes, the bridge integrated circuit die 222 is shown as a single die, although it is understood that the bridge integrated circuit die 222 may represent more than one die in different configurations, such as stacked, non-stacked, or both.

The bridge substrate 224 has bridge top contacts 234, such as contact pads or terminal pads, exposed at the bridge top surface 230 for further connections, such as connections for the internal interconnects 226. Bridge bottom contacts 236, such as contact pads or terminal pads, are exposed at the bridge bottom surface 232. The bridge interconnects 104 attach with the bridge bottom contacts 236. Interlayer connects 238, such as electrical vias, may connect a predetermimed selection of the bridge top contacts 234 and the bridge bottom contacts 236. An insulator 240, such as a dielectric, electrically isolates the bridge top contacts 234, the bridge bottom contacts 236, and the interlayer connects 238 from each other.

For illustrative purposes, the bridge substrate 224 is shown as a two layer substrate, although it is understood that the bridge substrate 224 may not be a two layer substrate. Also for illustrative purposes, the interlayer connects 238 are described as connecting the bridge top contacts 234 and the bridge bottom contacts 236, although it is understood that the interlayer connects 238 may not connect the bridge top contacts 234 and the bridge bottom contacts 236 but may instead form different connections, such as between trace layers (not shown) of the bridge substrate 224.

The bridge substrate 224 may serve multiple functions, such as providing planar rigidity for the bridge integrated circuit package system 102, and providing electrical transmission paths between the bridge integrated circuit die 222 and the bridge interconnects 104. The bridge substrate 224 may also serve as a redistribution structure for the routing traces (not shown) of different trace layers (not shown). The routing traces may be connected by a predetermined selection of the interlayer connects 238. The bridge substrate 224 and the bridge interconnects 104 may bridge transmission within the first substrate 108, within the second substrate 110, and between the first substrate 108 and the second substrate 110 without communication with the bridge integrated circuit die 222. The bridge integrated circuit package system 102 may be mounted on the first substrate 108 and the second substrate 110 by coupling at least one of the bridge interconnects 104 to the first substrate 108 and the second substrate 110. The at least one of the bridge interconnects 104 may be coupled to the first substrate adjacent to the separation 106 between the first integrated circuit package system 112 and second integrated circuit package system 116.

The bridge integrated circuit die 222 may interact, such as buffer signal strength, change protocol, or translate signal modulation, with signals transmitted between the first integrated circuit package system 112 and the second integrated circuit package system 116. The bridge integrated circuit die 222 may function as a pass or block gate for transmission.

The first integrated circuit package system 112 has a first integrated circuit die 242 over the first substrate 108. First interconnects 244, such as bond wires, connect the first integrated circuit die 242 and the first substrate 108. The first encapsulation 114, such as an epoxy mold compound, covers the first integrated circuit die 242, the first interconnects 244, and an interior portion of a first top surface 246 of the first substrate 108. The bridge integrated circuit package system 102 is not over the first encapsulation 114. The components 120 are over the first substrate 108 and are not covered by the bridge integrated circuit package system 102.

For illustrative purposes, the first integrated circuit die 242 is shown as a wire bond chip, although it is understood that the first integrated circuit die 242 may be a different type of chip, such as a flip chip. Also for illustrative purposes, the first integrated circuit die 242 is shown as a single die, although it is understood that the first integrated circuit die 242 may represent a different number of dice in different configurations, such as stacked, non-stacked, or both.

The first substrate 108 has first top contacts 248, such as contact pads or terminal pads, exposed at the first top surface 246 for further connections, such as connections for the first interconnects 244. The bridge interconnects 104 connect to the first top contacts 248. First bottom contacts 250, such as contact pads or terminal pads, are exposed at a first bottom surface 252 of the first substrate 108 for connections with first external interconnects 254, such as solder balls. The first substrate 108 may have a similar or substantially the same type of structures as the bridge substrate 224.

For illustrative purposes, the first substrate 108 is shown as a two layer substrate, although it is understood that the first substrate 108 may not be a two layer substrate. Also for illustrative purposes, the first integrated circuit package system 112 is shown having the first external interconnects 254, although it is understood that the first integrated circuit package system 112 may not have the first external interconnects 254.

The second integrated circuit package system 116 has a second integrated circuit die 256 over the second substrate 110. Second interconnects 258, such as bond wires, connect the second integrated circuit die 256 and the second substrate 110. The second encapsulation 118, such as an epoxy mold compound, covers the second integrated circuit die 256, the second interconnects 258, and an interior portion of a second top surface 260 of the second substrate 110. The bridge integrated circuit package system 102 is not over the second encapsulation 118. The components 120 are over the second substrate 110 and are not covered by the bridge integrated circuit package system 102.

For illustrative purposes, the second integrated circuit die 256 is shown as a wire bond chip, although it is understood that the second integrated circuit die 256 may be a different type of chip, such as a flip chip. Also for illustrative purposes, the second integrated circuit die 256 is shown as a single die, although it is understood that the second integrated circuit die 256 may represent a different number of dice in different configurations, such as stacked, non-stacked, or both.

The second substrate 110 has second top contacts 262, such as contact pads or terminal pads, exposed at the second top surface 260 for further connections, such as connections for the second interconnects 258. The bridge interconnects 104 connect to the second top contacts 262. Second bottom contacts 264, such as contact pads or terminal pads, are exposed at a second bottom surface 266 of the second substrate 110 for connections with second external interconnects 268, such as solder balls. The second substrate 110 may have a similar or substantially the same type of structures as the bridge substrate 224.

For illustrative purposes, the second substrate 110 is shown as a two layer substrate, although it is understood that the second substrate 110 may not be a two layer substrate. Also for illustrative purposes, the second integrated circuit package system 116 is shown having the second external interconnects 268, although it is understood that the second integrated circuit package system 116 may not have the second external interconnects 268.

Figure 3:
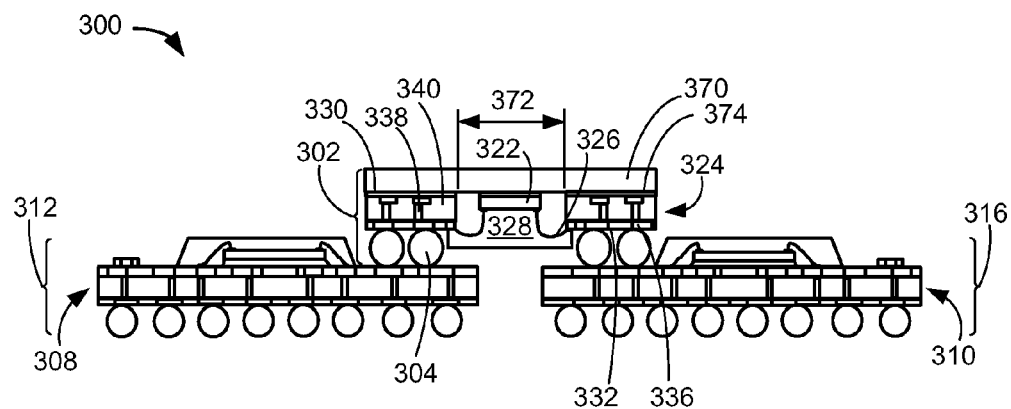
FIG. 3 is a cross-sectional view of a bridge stack integrated circuit package-on-package system along a line segment 2-2 of FIG. 1 in an alternative embodiment of the present invention.

Referring now to FIG. 3, therein is shown a cross-sectional view of a bridge stack integrated circuit package-on-package system 300 along a line segment 3—3 of FIG. 1 in an alternative embodiment of the present invention. The plan view of FIG. 1 may represent the plan view for the bridge stack integrated circuit package-on-package system 300.

The bridge stack integrated circuit package-on-package system 300 has a bridge integrated circuit package system 302, a first integrated circuit package system 312, and a second integrated circuit package system 316. The first integrated circuit package system 312 may be similar or substantially the same in structure as the first integrated circuit package system 112 of FIG. 2. The second integrated circuit package system 316 may be similar or substantially the same in structure as the second integrated circuit package system 116 of FIG. 2.

For brevity, the first integrated circuit package system 312 and the second integrated circuit package system 316 will be viewed substantially the same as the first integrated circuit package system 112 of FIG. 2 and the second integrated circuit package system 116 of FIG. 2, respectively. Although it is understood that the first integrated circuit package system 312 and the second integrated circuit package system 316 may be different from the first integrated circuit package system 112 of FIG. 2 and the second integrated circuit package system 116 of FIG. 2, respectively.

The bridge integrated circuit package system 302 has a planar structure 370, such as a stiffener for planar rigidity, a heat spreader, or an electromagnetic interference (EMI) shield, over a bridge top surface 330 of a bridge substrate 324, such as a laminate substrate. The planar structure 370 is also over an opening 372 of the bridge substrate 324. A bridge integrated circuit die 322 is in the opening 372 and attaches to a structure bottom surface 374 of the planar structure 370. Internal interconnects 326, such as bond wires, connect the bridge integrated circuit die 322 and a bridge bottom surface 332 of the bridge substrate 324 in a board on chip (BOC) configuration.

A package encapsulation 328, such as an epoxy mold compound, covers the bridge integrated circuit die 322 and the internal interconnects 326 as well as fills the opening 372. Bridge interconnects 304 attach to the bridge bottom surface 332 of the bridge substrate 324. For illustrative purposes, the bridge integrated circuit die 322 is shown as a single die, although it is understood that the bridge integrated circuit die 322 may represent more than one die in different configurations, such as stacked, non-stacked, or both.

Bridge bottom contacts 336, such as contact pads or terminal pads, are exposed at the bridge bottom surface 332. The bridge interconnects 304 attach between the bridge bottom contacts 336 and a first substrate 308 of the first integrated circuit package system 312 as well as between the bridge bottom contacts 336 and a second substrate 310 of the second integrated circuit package system 316.

Interlayer connects 338, such as electrical vias, may connect a predetermined selection of the bridge bottom contacts 336 to each other and to other routing traces (not shown) of the bridge substrate 324 at different trace layers (not shown) of the bridge substrate 324. An insulator 340, such as a dielectric, electrically isolates the bridge bottom contacts 336 and the interlayer connects 338 from each other. For illustrative purposes, the bridge substrate 324 is shown as a two layer substrate, although it is understood that the bridge substrate 324 may not be a two layer substrate.

The bridge substrate 324 may serve multiple functions, such as providing planar rigidity for the bridge integrated circuit package system 302, and providing electrical transmission paths between the bridge integrated circuit die 322 and the bridge interconnects 304. The bridge substrate 324 may also serve as a redistribution structure for the routing traces (not shown) of different trace layers (not shown). The routing traces may be connected by a predetermined selection of the interlayer connects 338. The bridge substrate 324 and the bridge interconnects 304 may bridge transmission within the first substrate 308, within the second substrate 310, and between the first substrate 308 and the second substrate 310 without communication with the bridge integrated circuit die 322.

The bridge integrated circuit die 322 may interact, such as buffer signal strength, change protocol, or translate signal modulation, with signals transmitted between the first integrated circuit package system 312 and the second integrated circuit package system 316. The bridge integrated circuit die 322 may function as a pass or block gate for transmission.

Figure 4:
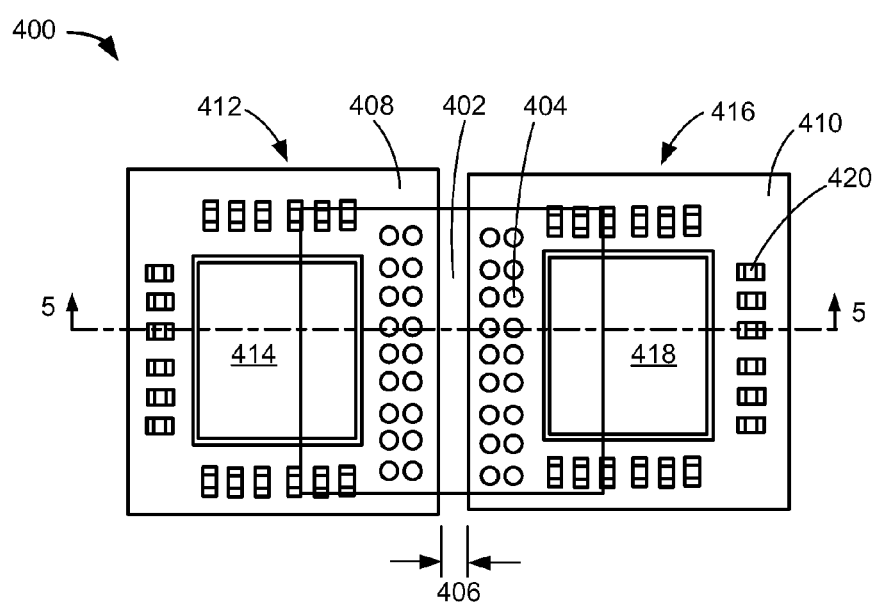
FIG. 4 is a plan view of a bridge stack integrated circuit package-on-package system in another alternative embodiment of the present invention.

Referring now to FIG. 4, therein is shown a plan view of a bridge stack integrated circuit package-on-package system 400 in another alternative embodiment of the present invention. The plan view depicts a bridge integrated circuit package system 402 having bridge interconnects 404, such as solder balls, solder paste, or conductive adhesive. The bridge integrated circuit package system 402 functions as a bridge over a separation 406 between a first substrate 408, such as a laminate substrate, a lead frame, a printed circuit board, or a carrier, and a second substrate 410, such as a laminate substrate, a lead frame, a printed circuit board, or a carrier.

A first integrated circuit package system 412, such as an integrated circuit package system, includes a first encapsulation 414, such as an epoxy mold compound or glob top, over the first substrate 408. A second integrated circuit package system 416, such as an integrated circuit package system, includes the second substrate 410 and a second encapsulation 418, such as an epoxy mold compound or glob top, over the second substrate 410. Components 420, such as discrete passive components, are over the first substrate 408 and the second substrate 410. For illustrative purposes, the components 420 are shown substantially the same over the first substrate 408 and the second substrate 410, although it is understood that the components 420 may be different over the first substrate 408 and the second substrate 410.

The bridge integrated circuit package system 402 is partially over the first encapsulation 414 and the second encapsulation 418. The bridge integrated circuit package system 402 is also over a portion of the components 420 over both the first substrate 408 and the second substrate 410.

Figure 5:
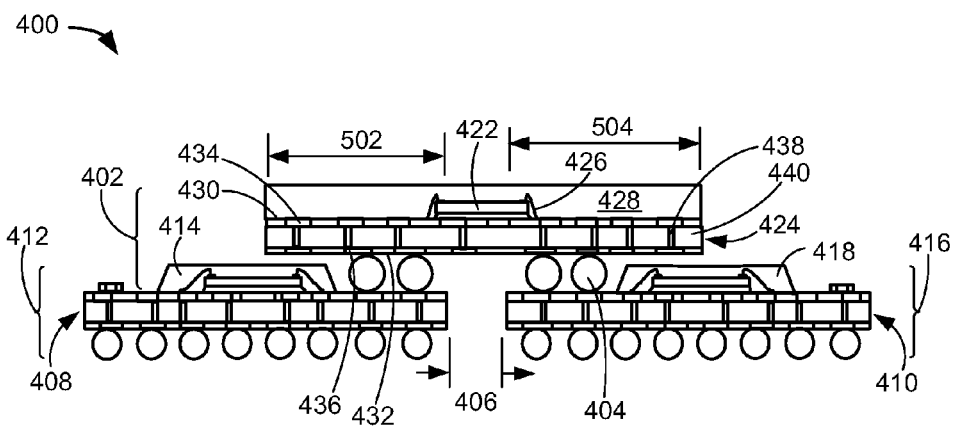
FIG. 5 is a cross-sectional view of the bridge stack integrated circuit package-on-package system along a line segment 5-5 of FIG. 4.

Referring now to FIG. 5, therein is shown a cross-sectional view of the bridge stack integrated circuit package-on-package system 400 along a line segment 5—5 of FIG. 4. The cross-sectional view depicts the bridge integrated circuit package system 402 connecting the first substrate 408 of the first integrated circuit package system 412 and the second substrate 410 of the second integrated circuit package system 416. The bridge integrated circuit package system 402 is over the separation 406 between the first integrated circuit package system 412 and the second integrated circuit package system 416. The first integrated circuit package system 412 may be similar or substantially the same in structure as the first integrated circuit package system 112 of FIG. 2. The second integrated circuit package system 416 may be similar or substantially the same in structure as the second integrated circuit package system 116 of FIG. 2.

For brevity, the first integrated circuit package system 412 and the second integrated circuit package system 416 will be viewed substantially the same as the first integrated circuit package system 412 of FIG. 2 and the second integrated circuit package system 116 of FIG. 2, respectively. Although it is understood that the first integrated circuit package system 412 and the second integrated circuit package system 416 may be different from the first integrated circuit package system 112 of FIG. 2 and the second integrated circuit package system 116 of FIG. 2, respectively.

The bridge integrated circuit package system 402 forms a first overhang 502 over the first encapsulation 414. The bridge integrated circuit package system 402 also forms a second overhang 504 over the second encapsulation 418. The bridge integrated circuit package system 402 may be similar or substantially the same in structure to the bridge integrated circuit package system 102 of FIG. 2.

The bridge integrated circuit package system 402 has a bridge integrated circuit die 422 over a bridge substrate 424, such as a laminate substrate. Internal interconnects 426, such as bond wires, connect the bridge integrated circuit die 422 and the bridge substrate 424. A package encapsulation 428, such as an epoxy mold compound, over a bridge top surface 430 of the bridge substrate 424 covers the bridge integrated circuit die 422 and the internal interconnects 426. The bridge interconnects 404 attach to a bridge bottom surface 432 of the bridge substrate 424.

The bridge substrate 424 has bridge top contacts 434, such as contact pads or terminal pads, exposed at the bridge top surface 430 for further connections, such as connections for the internal interconnects 426. Bridge bottom contacts 436, such as contact pads or terminal pads, are exposed at the bridge bottom surface 432. The bridge interconnects 404 attach with the bridge bottom contacts 436. Interlayer connects 438, such as electrical vias, may connect a predetermined selection of the bridge top contacts 434 and the bridge bottom contacts 436. An insulator 440, such as a dielectric, electrically isolates the bridge top contacts 434, the bridge bottom contacts 436, and the interlayer connects 438 from each other.

The bridge substrate 424 may serve multiple functions, such as providing planar rigidity for the bridge integrated circuit package system 402, and providing electrical transmission paths between the bridge integrated circuit die 422 and the bridge interconnects 404. The bridge substrate 424 may also serve as a redistribution structure for the routing traces (not shown) of different trace layers (not shown). The routing traces may be connected by a predetermined selection of the interlayer connects 438. The bridge substrate 424 and the bridge interconnects 404 may bridge transmission within the first substrate 408, within the second substrate 410, and between the first substrate 408 and the second substrate 410 without communication with the bridge integrated circuit die 422.

The bridge integrated circuit die 422 may interact, such as buffer signal strength, change protocol, or translate signal modulation, with signals transmitted between the first integrated circuit package system 412 and the second integrated circuit package system 416. The bridge integrated circuit die 422 may function as a pass or block gate for transmission.

Figure 6:
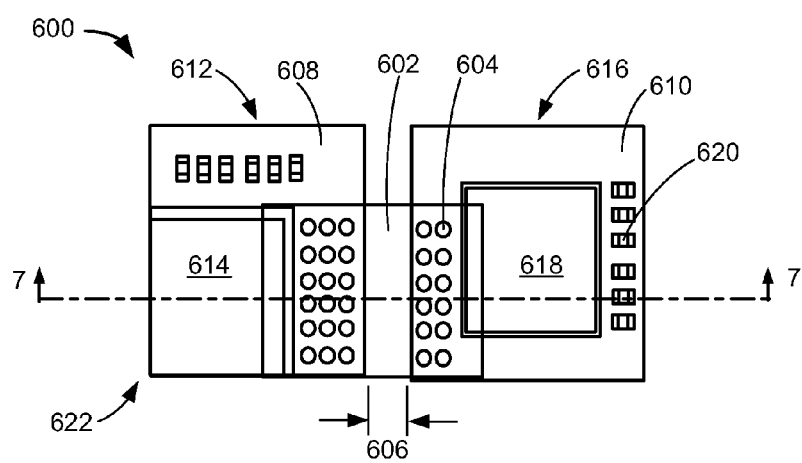
FIG. 6 is a plan view of a bridge stack integrated circuit package-on-package system in yet another alternative embodiment of the present invention.

Referring now to FIG. 6, therein is shown a plan view of a bridge stack integrated circuit package-on-package system 600 in yet another alternative embodiment of the present invention. The plan view depicts a bridge integrated circuit package system 602 having bridge interconnects 604, such as solder balls, solder paste, or conductive adhesive. The bridge integrated circuit package system 602 functions as a bridge over a separation 606 between a first substrate 608, such as a laminate substrate, a lead frame, a printed circuit board, or a carrier, and a second substrate 610, such as a laminate substrate, a lead frame, a printed circuit board, or a carrier.

A first integrated circuit package system 612, such as an integrated circuit package system, includes a first encapsulation 614, such as an epoxy mold compound or glob top, in an offset configuration over the first substrate 608. The offset configuration of the first encapsulation 614 provides additional surface area of the first substrate 608 for connecting the bridge interconnects 604 with the first substrate 608. Three rows of the bridge interconnects 604 are shown over the first substrate 608 and two rows of the bridge interconnects 604 are shown over the second substrate 610. For illustrative purposes, the offset configuration has the first encapsulation 614 from a corner 622 of the first substrate 608, although it is understood that the first encapsulation 614 may be in a different configuration, such as not at the corner 622 or a different corner.

A second integrated circuit package system 616, such as an integrated circuit package system, includes the second substrate 610 and a second encapsulation 618, such as an epoxy mold compound or glob top, over the second substrate 610. Components 620, such as discrete passive components, are over the first substrate 608 and the second substrate 610. For illustrative purposes, the components 620 are shown substantially the same over the first substrate 608 and the second substrate 610, although it is understood that the components 620 may be different over the first substrate 608 and the second substrate 610. The bridge integrated circuit package system 602 is partially over the first encapsulation 614 and the second encapsulation 618.

Figure 7:
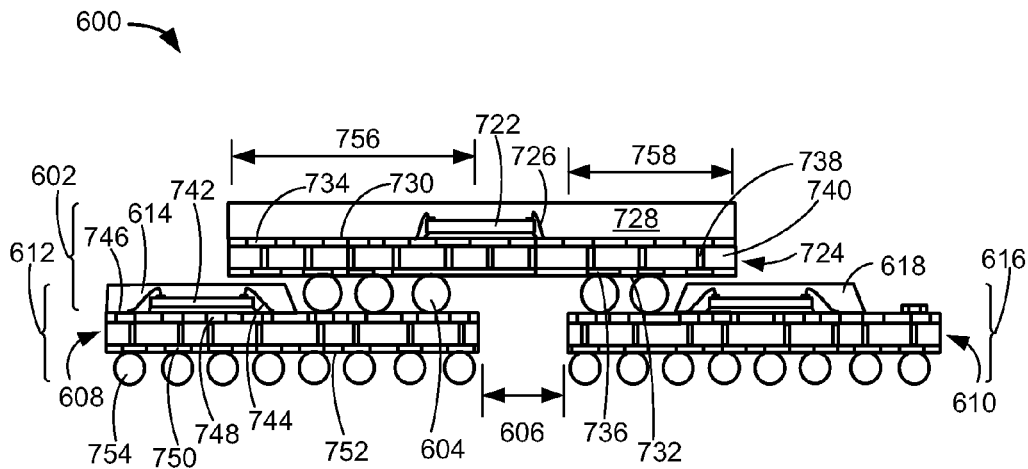
FIG. 7 is a cross-sectional view of the bridge stack integrated circuit package-on-package system along a line segment 7-7 of FIG. 6.

Referring now to FIG. 7, therein is shown a cross-sectional view of the bridge stack integrated circuit package-on-package system 600 along a line segment 7—7 of FIG. 6. The cross-sectional view depicts the bridge integrated circuit package system 602 connecting the first substrate 608 of the first integrated circuit package system 612 and the second substrate 610 of the second integrated circuit package system 616. The bridge integrated circuit package system 602 is over the separation 606 between the first integrated circuit package system 612 and the second integrated circuit package system 616.

The second integrated circuit package system 616 may be similar or substantially the same in structure as the second integrated circuit package system 116 of FIG. 2. For brevity, the second integrated circuit package system 616 will be viewed substantially the same as the second integrated circuit package system 116 of FIG. 2. Although it is understood that the second integrated circuit package system 616 may be different from the second integrated circuit package system 116 of FIG. 2.

The bridge integrated circuit package system 602 forms a first overhang 756 over the first encapsulation 614. The bridge integrated circuit package system 602 also forms a second overhang 758 over the second encapsulation 618. The bridge integrated circuit package system 602 may be similar in structure to the bridge integrated circuit package system 102 of FIG. 2.

The bridge integrated circuit package system 602 has a bridge integrated circuit die 722 over a bridge substrate 724, such as a laminate substrate. Internal interconnects 726, such as bond wires, connect the bridge integrated circuit die 722 and the bridge substrate 724. A package encapsulation 728, such as an epoxy mold compound, over a bridge top surface 730 of the bridge substrate 724 covers the bridge integrated circuit die 722 and the internal interconnects 726. The bridge interconnects 604 attach to a bridge bottom surface 732 of the bridge substrate 724.

The bridge substrate 724 has bridge top contacts 734, such as contact pads or terminal pads, exposed at the bridge top surface 730 for further connections, such as connections for the internal interconnects 726. Bridge bottom contacts 736, such as contact pads or terminal pads, are exposed at the bridge bottom surface 732. The bridge interconnects 604 attach with the bridge bottom contacts 736. Interlayer connects 738, such as electrical vias, may connect a predetermined selection of the bridge top contacts 734 and the bridge bottom contacts 736. An insulator 740, such as a dielectric, electrically isolates the bridge top contacts 734, the bridge bottom contacts 736, and the interlayer connects 738 from each other.

The bridge substrate 724 may serve multiple functions, such as providing planar rigidity for the bridge integrated circuit package system 602, and providing electrical transmission paths between the bridge integrated circuit die 722 and the bridge interconnects 604. The bridge substrate 724 may also serve as a redistribution structure for the routing traces (not shown) of different trace layers (not shown). The routing traces may be connected by a predetermined selection of the interlayer connects 738. The bridge substrate 724 and the bridge interconnects 604 may bridge transmission within the first substrate 608, within the second substrate 610, and between the first substrate 608 and the second substrate 610 without communication with the bridge integrated circuit die 722.

The bridge integrated circuit die 722 may interact, such as buffer signal strength, change protocol, or translate signal modulation, with signals transmitted between the first integrated circuit package system 612 and the second integrated circuit package system 616. The bridge integrated circuit die 722 may function as a pass or block gate for transmission.

The first integrated circuit package system 612 has the first encapsulation 614 in an offset configuration over the first substrate 608 and may be similar in structure as the first integrated circuit package system 112 of FIG. 2. The first integrated circuit package system 612 has a first integrated circuit die 742 also in the offset configuration over the first substrate 608. First interconnects 744, such as bond wires, connect the first integrated circuit die 742 and the first substrate 608. The first encapsulation 614, such as an epoxy mold compound, covers the first integrated circuit die 742, the first interconnects 744, and a first top surface 746 of the first substrate 608.

For illustrative purposes, the first integrated circuit die 742 is shown as a wire bond chip, although it is understood that the first integrated circuit die 742 may be a different type of chip, such as a flip chip. Also for illustrative purposes, the first integrated circuit die 742 is shown as a single die, although it is understood that the first integrated circuit die 742 may represent a different number of dice in different configurations, such as stacked, non-stacked, or both.

The first substrate 608 has first top contacts 748, such as contact pads or terminal pads, exposed at the first top surface 746 for further connections, such as connections for the first interconnects 744. The bridge interconnects 604 connect to a predetermined portion of the first top contacts 748. First bottom contacts 750, such as contact pads or terminal pads, are exposed at a first bottom surface 752 for connections with first external interconnects 754, such as solder balls. The first substrate 608 may have a similar or substantially the same type of structures as the bridge substrate 724.

For illustrative purposes, the first substrate 608 is shown as a two layer substrate, although it is understood that the first substrate 608 may not be a two layer substrate. Also for illustrative purposes, the first integrated circuit package system 612 is shown having the first external interconnects 754, although it is understood that the first integrated circuit package system 612 may not have the first external interconnects 754.

Figure 8:
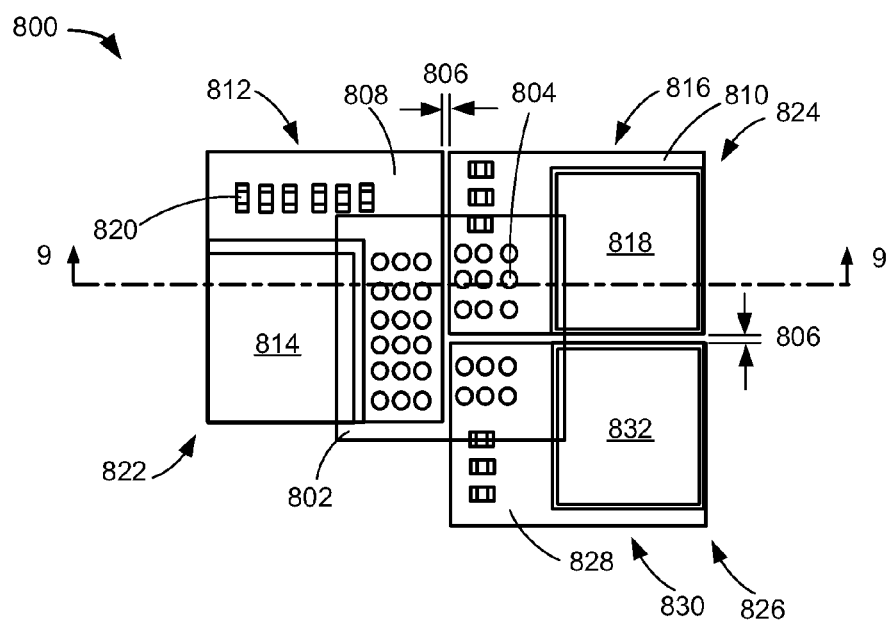
FIG. 8 is a plan view of a bridge stack integrated circuit package-on-package system in yet another alternative embodiment of the present invention.

Referring now to FIG. 8, therein is shown a plan view of a bridge stack integrated circuit package-on-package system 800 in yet another alternative embodiment of the present invention. The plan view depicts a bridge integrated circuit package system 802 having bridge interconnects 804, such as solder balls, solder paste, or conductive adhesive. The bridge integrated circuit package system 802 functions as a bridge over separations 806 between a first substrate 808, a second substrate 810 and a third substrate 828.

For example, the first substrate 808, the second substrate 810, and the third substrate 828 may be a laminate substrate, a lead frame, a printed circuit board, or a carrier. For illustrative purposes, the first substrate 808, the second substrate 810, and the third substrate 828 are shown as substantially the same type, although it is understood that the first substrate 808, the second substrate 810, and the third substrate 828 may be different from one another. Also for illustrative purposes, the separations 806 are shown substantially the same as between the first substrate 808, the second substrate 810, and the third substrate 828, although it is understood that the separations 806 may not equal.

A first integrated circuit package system 812, such as an integrated circuit package system, includes a first encapsulation 814, such as an epoxy mold compound or glob top, in an offset configuration over the first substrate 808. The offset configuration of the first encapsulation 814 provides additional surface area of the first substrate 808 for connecting the bridge interconnects 804 with the first substrate 808. For illustrative purposes, the offset configuration has the first encapsulation 814 from a first corner 822 of the first substrate 808, although it is understood that the first encapsulation 814 may be in a different configuration, such as not from the first corner 822.

A second integrated circuit package system 816, such as an integrated circuit package system, includes the second substrate 810 and a second encapsulation 818, such as an epoxy mold compound or glob top, in an offset configuration over the second substrate 810. The offset configuration of the second encapsulation 818 provides additional surface area of the second substrate 810 for connecting the bridge interconnects 804 with the second substrate 810. For illustrative purposes, the offset configuration has the second encapsulation 818 at a second corner 824 of the second substrate 810, although it is understood that the second encapsulation 818 may be in a different configuration, such as not at the second corner 824.

A third integrated circuit package system 830, such as an integrated circuit package system, includes the third substrate 828 and a third encapsulation 832, such as an epoxy mold compound or glob top, in an offset configuration over the third substrate 828. The offset configuration of the third encapsulation 832 provides additional surface area of the third substrate 828 for connecting the bridge interconnects 804 with the third substrate 828. For illustrative purposes, the offset configuration has the third encapsulation 832 at a third corner 826 of the third substrate 828, although it is understood that the third encapsulation 832 may be in a different configuration, such as not at the third corner 826.

Three rows of the bridge interconnects 804 are shown over the first substrate 808, the second substrate 810, and the third substrate 828. Components 820, such as discrete passive components, are over the first substrate 808, the second substrate 810, and the third substrate 828. The bridge integrated circuit package system 802 is partially over the first encapsulation 814, the second encapsulation 818, and the third encapsulation 832. For illustrative purposes, the components 820 are shown substantially the same over the first substrate 808, the second substrate 810, and the third substrate 828, although it is understood that the components 820 may be different over the first substrate 808, the second substrate 810, and the third substrate 828.

Figure 9:
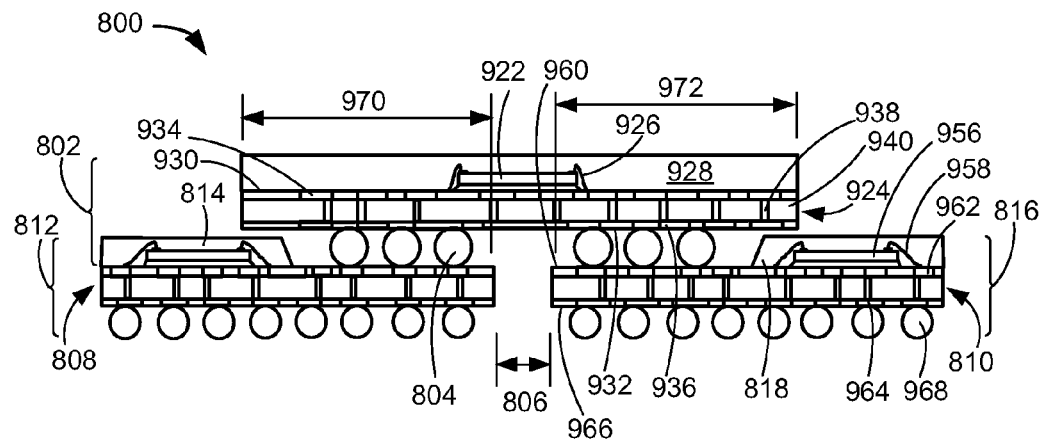
FIG. 9 is a cross-sectional view of the bridge stack integrated circuit package-on-package system along a line segment 9-9 of FIG. 8.

Referring now to FIG. 9, therein is shown a cross-sectional view of the bridge stack integrated circuit package-on-package system 800 along a line segment 9—9 of FIG. 8. The cross-sectional view depicts the bridge integrated circuit package system 802 connecting the first substrate 808 of the first integrated circuit package system 812 and the second substrate 810 of the second integrated circuit package system 816. The bridge integrated circuit package system 802 is over one of the separations 806 between the first integrated circuit package system 812 and the second integrated circuit package system 816.

The bridge integrated circuit package system 802 forms a first overhang 970 over the first encapsulation 814. The bridge integrated circuit package system 802 also forms a second overhang 972 over the second encapsulation 818. The bridge integrated circuit package system 802 may be similar in structure to the bridge integrated circuit package system 102 of FIG. 2.

The bridge integrated circuit package system 802 has a bridge integrated circuit die 922 over a bridge substrate 924, such as a laminate substrate. Internal interconnects 926, such as bond wires, connect the bridge integrated circuit die 922 and the bridge substrate 924. A package encapsulation 928, such as an epoxy mold compound, over a bridge top surface 930 of the bridge substrate 924 covers the bridge integrated circuit die 922 and the internal interconnects 926. The bridge interconnects 804 attach to a bridge bottom surface 932 of the bridge substrate 924.

The bridge substrate 924 has bridge top contacts 934, such as contact pads or terminal pads, exposed at the bridge top surface 930 for further connections, such as connections for the internal interconnects 926. Bridge bottom contacts 936, such as contact pads or terminal pads, are exposed at the bridge bottom surface 932. The bridge interconnects 804 attach with the bridge bottom contacts 936. Interlayer connects 938, such as electrical vias, may connect a predetermined selection of the bridge top contacts 934 and the bridge bottom contacts 936. An insulator 940, such as a dielectric, electrically isolates the bridge top contacts 934, the bridge bottom contacts 936, and the interlayer connects 938 from each other.

The bridge substrate 924 may serve multiple functions, such as providing planar rigidity for the bridge integrated circuit package system 802, and providing electrical transmission paths between the bridge integrated circuit die 922 and the bridge interconnects 804. The bridge substrate 924 may also serve as a redistribution structure for the routing traces (not shown) of different trace layers (not shown). The routing traces may be connected by a predetermined selection of the interlayer connects 938. The bridge substrate 924 and the bridge interconnects 804 may bridge transmission within the first substrate 808, within the second substrate 810, within the third substrate 828 of FIG. 8, and between the first substrate 808, the second substrate 810, and the third substrate 828 without communication with the bridge integrated circuit die 922.

The bridge integrated circuit die 922 may interact, such as buffer signal strength, change protocol, or translate signal modulation, with signals transmitted between the first integrated circuit package system 812, the second integrated circuit package system 816, and the third integrated circuit package system 830 of FIG. 8. The bridge integrated circuit die 922 may function as a pass or block gate for transmission.

The first integrated circuit package system 812 may be similar or substantially the same in structure as the first integrated circuit package system 612 of FIG. 7. For brevity, the first integrated circuit package system 812 will be viewed substantially the same as the first integrated circuit package system 612 of FIG. 7. Although it is understood that the first integrated circuit package system 812 may be different from the first integrated circuit package system 612 of FIG. 7.

The second integrated circuit package system 816 has the second encapsulation 818 in an offset configuration over the second substrate 810. The second integrated circuit package system 816 has a second integrated circuit die 956 also in the offset configuration over the second substrate 810. Second interconnects 958, such as bond wires, connect the second integrated circuit die 956 and the second substrate 810. The second encapsulation 818, such as an epoxy mold compound, covers the second integrated circuit die 956, the second interconnects 958, and a portion of a second top surface 960 of the second substrate 810.

For illustrative purposes, the second integrated circuit die 956 is shown as a wire bond chip, although it is understood that the second integrated circuit die 956 may be a different type of chip, such as a flip chip. Also for illustrative purposes, the second integrated circuit die 956 is shown as a single die, although it is understood that the second integrated circuit die 956 may represent a different number of dice in different configurations, such as stacked, non-stacked, or both.

The second substrate 810 has second top contacts 962, such as contact pads or terminal pads, exposed at the second top surface 960 for further connections, such as connections for the second interconnects 958. The bridge interconnects 804 connect to a predetermined portion of the second top contacts 962. Second bottom contacts 964, such as contact pads or terminal pads, are exposed at a second bottom surface 966 for connections with second external interconnects 968, such as solder balls. The second substrate 810 may have a similar or substantially the same type of structures as the bridge substrate 924.

For illustrative purposes, the second substrate 810 is shown as a two layer substrate, although it is understood that the second substrate 810 may not be a two layer substrate. Also for illustrative purposes, the second integrated circuit package system 816 is shown having the second external interconnects 968, although it is understood that the second integrated circuit package system 816 may not have the second external interconnects 968.

Figure 10:
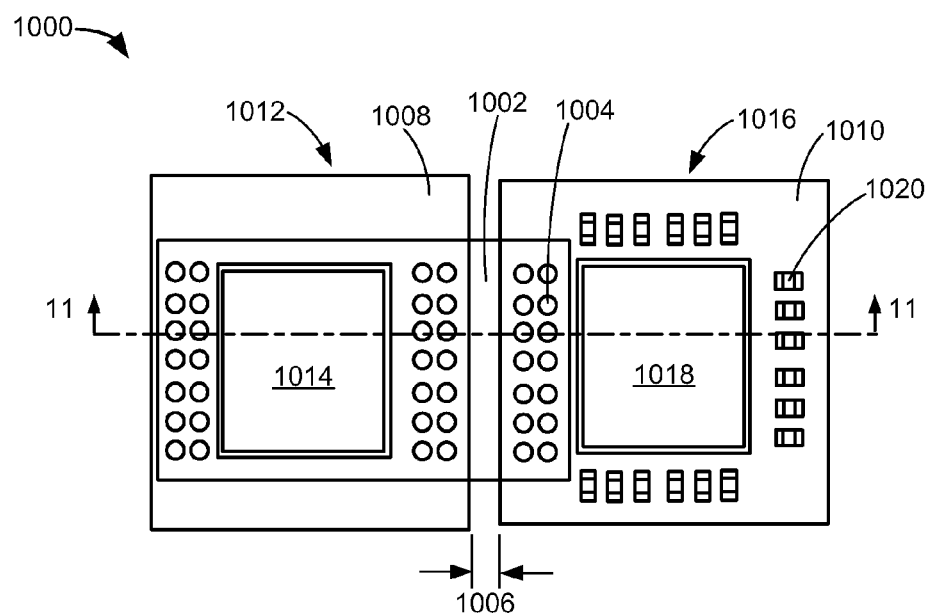
FIG. 10 is a plan view of a bridge stack integrated circuit package-on-package system in yet another alternative embodiment of the present invention.

Referring now to FIG. 10, therein is shown a plan view of a bridge stack integrated circuit package-on-package system 1000 in yet another alternative embodiment of the present invention. The plan view depicts a bridge integrated circuit package system 1002 having bridge interconnects 1004, such as solder balls, solder paste, or conductive adhesive.

The bridge integrated circuit package system 1002 functions as a bridge over a separation 1006 between a first substrate 1008, such as a laminate substrate, a lead frame, a printed circuit board, or a carrier, and a second substrate 1010, such as a laminate substrate, a lead frame, a printed circuit board, or a carrier.

A first integrated circuit package system 1012, such as an integrated circuit package system, includes a first encapsulation 1014, such as an epoxy mold compound or glob top, over the first substrate 1008. A second integrated circuit package system 1016, such as an integrated circuit package system, includes the second substrate 1010 and a second encapsulation 1018, such as an epoxy mold compound or glob top, over the second substrate 1010. Components 1020, such as discrete passive components, are over the second substrate 1010.

The bridge integrated circuit package system 1002 is stacked over the first integrated circuit package system 1012. This configuration allows more connections of the bridge interconnects 1004 between the bridge integrated circuit package system 1002 and the first substrate 1008. For illustrative purposes, the bridge interconnects 1004 over the first substrate 1008 and the second substrate 1010 are shown substantially the same, although it is understood that the bridge interconnects 1004 over the first substrate 1008 and the second substrate 1010 may be different, such as different types or sizes.

Figure 11:
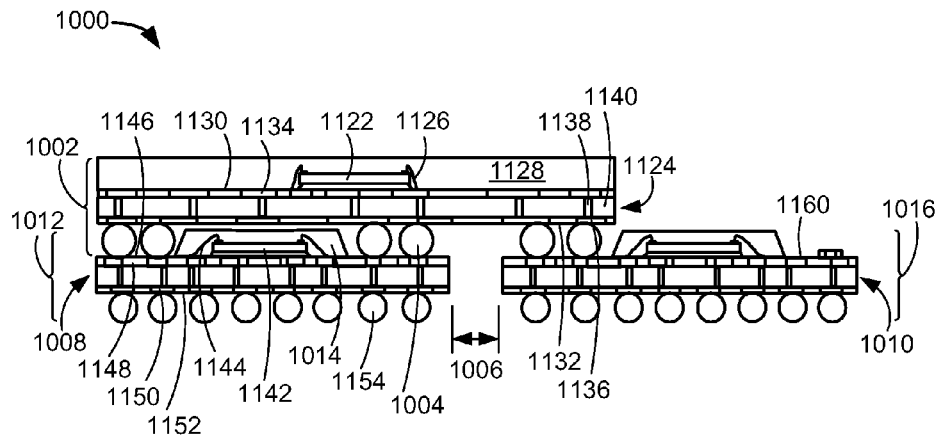
FIG. 11 is a cross-sectional view of the bridge stack integrated circuit package-on-package system along a line segment 11-11 of FIG. 10.

Referring now to FIG. 11, therein is shown a cross-sectional view of the bridge stack integrated circuit package-on-package system 1000 along a line segment 11—11 of FIG. 10. The cross-sectional view depicts the bridge integrated circuit package system 1002 connecting the first substrate 1008 of the first integrated circuit package system 1012 and the second substrate 1010 of the second integrated circuit package system 1016. The bridge integrated circuit package system 1002 is over the separation 1006 between the first integrated circuit package system 1012 and the second integrated circuit package system 1016.

The second integrated circuit package system 1016 may be similar or substantially the same in structure as the second integrated circuit package system 116 of FIG. 2. For brevity, the second integrated circuit package system 1016 will be viewed substantially the same as the second integrated circuit package system 116 of FIG. 2. Although it is understood that the second integrated circuit package system 1016 may be different from the second integrated circuit package system 116 of FIG. 2.

The bridge integrated circuit package system 1002 is stacked over the first encapsulation 1014. The cross-sectional view depicts the bridge interconnects 1004 on both sides of the first encapsulation 1014 over the first substrate 1008. The bridge interconnects 1004 are also over the second substrate 1010.

The bridge integrated circuit package system 1002 has a bridge integrated circuit die 1122 over a bridge substrate 1124, such as a laminate substrate. Internal interconnects 1126, such as bond wires, connect the bridge integrated circuit die 1122 and the bridge substrate 1124. A package encapsulation 1128, such as an epoxy mold compound, over a bridge top surface 1130 of the bridge substrate 1124 covers the bridge integrated circuit die 1122 and the internal interconnects 1126. The bridge interconnects 1004 attach to a bridge bottom surface 1132 of the bridge substrate 1124.

The bridge substrate 1124 has bridge top contacts 1134, such as contact pads or terminal pads, exposed at the bridge top surface 1130 for further connections, such as connections for the internal interconnects 1126. Bridge bottom contacts 1136, such as contact pads or terminal pads, are exposed at the bridge bottom surface 1132. The bridge interconnects 1004 attach with the bridge bottom contacts 1136. Interlayer connects 1138, such as electrical vias, may connect a predetermined selection of the bridge top contacts 1134 and the bridge bottom contacts 1136. An insulator 1140, such as a dielectric, electrically isolates the bridge top contacts 1134, the bridge bottom contacts 1136, and the interlayer connects 1138 from each other.

The bridge substrate 1124 may serve multiple functions, such as providing planar rigidity for the bridge integrated circuit package system 1002, and providing electrical transmission paths between the bridge integrated circuit die 1122 and the bridge interconnects 1004. The bridge substrate 1124 may also serve as a redistribution structure for the routing traces (not shown) of different trace layers (not shown). The routing traces may be connected by a predetermined selection of the interlayer connects 1138. The bridge substrate 1124 and the bridge interconnects 1004 may bridge transmission within the first substrate 1008, within the second substrate 1010, and between the first substrate 1008 and the second substrate 1010 without communication with the bridge integrated circuit die 1122.

The bridge integrated circuit die 1122 may interact, such as buffer signal strength, change protocol, or translate signal modulation, with signals transmitted between the first integrated circuit package system 1012 and the second integrated circuit package system 1016. The bridge integrated circuit die 1122 may function as a pass or block gate for transmission.

The first integrated circuit package system 1012 has a first integrated circuit die 1142 over the first substrate 1008. First interconnects 1144, such as bond wires, connect the first integrated circuit die 1142 and the first substrate 1008. The first encapsulation 1014, such as an epoxy mold compound, covers the first integrated circuit die 1142, the first interconnects 1144, and a portion of a first top surface 1146 of the first substrate 1008. The first top surface 1146 and a second top surface 1160 of the second substrate 1010 are depicted as substantially coplanar such that the bridge interconnects 1004 are substantially the same over the first substrate 1008 and the second substrate 1010.

For illustrative purposes, the first integrated circuit die 1142 is shown as a wire bond chip, although it is understood that the first integrated circuit die 1142 may be a different type of chip, such as a flip chip. Also for illustrative purposes, the first integrated circuit die 1142 is shown as a single die, although it is understood that the first integrated circuit die 1142 may represent a different number of dice in different configurations, such as stacked, non-stacked, or both.

The first substrate 1008 has first top contacts 1148, such as contact pads or terminal pads, exposed at the first top surface 1146 for further connections, such as connections for the first interconnects 1144. The bridge interconnects 1004 connect to a predetermined portion of the first top contacts 1148. First bottom contacts 1150, such as contact pads or terminal pads, are exposed at a first bottom surface 1152 for connections with first external interconnects 1154, such as solder balls. The first substrate 1008 may have a similar or substantially the same type of structures as the bridge substrate 1124.

For illustrative purposes, the first substrate 1008 is shown as a two layer substrate, although it is understood that the first substrate 1008 may not be a two layer substrate. Also for illustrative purposes, the first integrated circuit package system 1012 is shown having the first external interconnects 1154, although it is understood that the first integrated circuit package system 1012 may not have the first external interconnects 1154.

Figure 12:
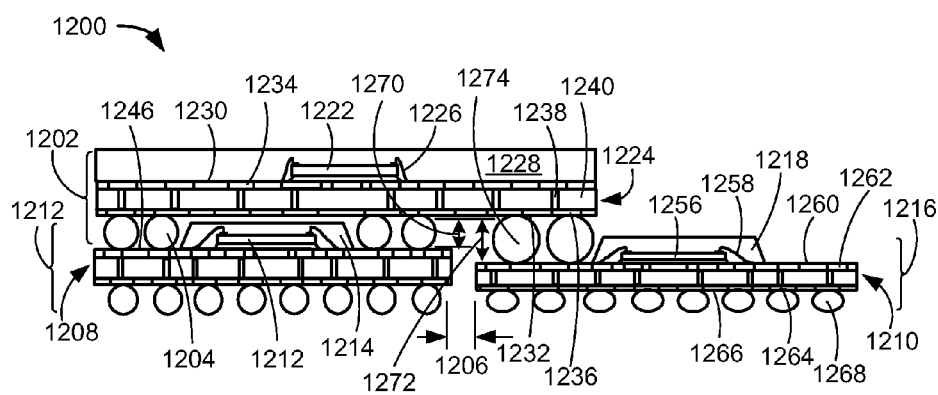
FIG. 12 is a cross-sectional view of the bridge stack integrated circuit package-on-package system along a line segment 12-12 of FIG. 10 in yet another embodiment of the present invention.

Referring now to FIG. 12, therein is shown a cross-sectional view of a bridge stack integrated circuit package-on-package system 1200 along a line segment 11—11 of FIG. 10 in yet another embodiment of the present invention. The plan view of FIG. 10 may also represent the bridge stack integrated circuit package-on-package system 1200 having first bridge interconnects 1204 over a first substrate 1208 and second bridge interconnects 1274 over a second substrate 1210. The cross-sectional view depicts a bridge integrated circuit package system 1202 connecting the first substrate 1208 of a first integrated circuit package system 1212 and the second substrate 1210 of a second integrated circuit package system 1216. The bridge integrated circuit package system 1202 is over a separation 1206 between the first integrated circuit package system 1212 and the second integrated circuit package system 1216.

The first integrated circuit package system 1212 may be similar or substantially the same in structure as the first integrated circuit package system 1012 of FIG. 11. For brevity, the first integrated circuit package system 1212 will be viewed substantially the same as the first integrated circuit package system 1012 of FIG. 11. Although it is understood that the first integrated circuit package system 1212 may be different from the first integrated circuit package system 1012 of FIG. 11.

The bridge integrated circuit package system 1202 is stacked over a first encapsulation 1214. The cross-sectional view depicts the first bridge interconnects 1204 on both sides of the first encapsulation 1214 over the first substrate 1208. The second bridge interconnects 1274 are also over the second substrate 1210.

The bridge integrated circuit package system 1202 has a bridge integrated circuit die 1222 over a bridge substrate 1224, such as a laminate substrate. Internal interconnects 1226, such as bond wires, connect the bridge integrated circuit die 1222 and the bridge substrate 1224. A package encapsulation 1228, such as an epoxy mold compound, over a bridge top surface 1230 of the bridge substrate 1224 covers the bridge integrated circuit die 1222 and the internal interconnects 1226.

The bridge substrate 1224 has bridge top contacts 1234, such as contact pads or terminal pads, exposed at the bridge top surface 1230 for further connections, such as connections for the internal interconnects 1226. Bridge bottom contacts 1236, such as contact pads or terminal pads, are exposed at a bridge bottom surface 1232. The first bridge interconnects 1204 and the second bridge interconnects 1274 attach with the bridge bottom contacts 1236. Interlayer connects 1238, such as electrical vias, may connect a predetermined selection of the bridge top contacts 1234 and the bridge bottom contacts 1236. An insulator 1240, such as a dielectric, electrically isolates the bridge top contacts 1234, the bridge bottom contacts 1236, and the interlayer connects 1238 from each other.

The bridge substrate 1224 may serve multiple functions, such as providing planar rigidity for the bridge integrated circuit package system 1202, and providing electrical transmission paths between the bridge integrated circuit die 1222, the first bridge interconnects 1204, and the second bridge interconnects 1274. The bridge substrate 1224 may also serve as a redistribution structure for the routing traces (not shown) of different trace layers (not shown). The routing traces may be connected by a predetermined selection of the interlayer connects 1238.

The bridge substrate 1224 and the first bridge interconnects 1204 may bridge transmission within the first substrate 1208 without communication with the bridge integrated circuit die 1222. The bridge substrate 1224, the first bridge interconnects 1204, and the second bridge interconnects 1274 may bridge between the first substrate 1208 and the second substrate 1210 without communication with the bridge integrated circuit die 1222. The bridge substrate 1224 and the second bridge interconnects 1274 may bridge transmission within the second substrate 1210 without communication with the bridge integrated circuit die 1222.

The bridge integrated circuit die 1222 may interact, such as buffer signal strength, change protocol, or translate signal modulation, with signals transmitted between the first integrated circuit package system 1212 and the second integrated circuit package system 1216. The bridge integrated circuit die 1222 may function as a pass or block gate for transmission.

The second integrated circuit package system 1216 has a second integrated circuit die 1256 over the second substrate 1210. Second interconnects 1258, such as bond wires, connect the second integrated circuit die 1256 and the second substrate 1210. A second encapsulation 1218, such as an epoxy mold compound, covers the second integrated circuit die 1256, the second interconnects 1258, and a second top surface 1260 of the second substrate 1210.

The second top surface 1260 and a first top surface 1246 of the first substrate 1208 are depicted as non-coplanar. The first bridge interconnects 1204 have a first height 1270 and the second bridge interconnects 1274 have a second height 1272. The difference between the first height 1270 and the second height 1272 helps compensate for the non-coplanarity between the first top surface 1246 and the second top surface 1260.

For illustrative purposes, the second integrated circuit die 1256 is shown as a wire bond chip, although it is understood that the second integrated circuit die 1256 may be a different type of chip, such as a flip chip. Also for illustrative purposes, the second integrated circuit die 1256 is shown as a single die, although it is understood that the second integrated circuit die 1256 may represent a different number of dice in different configurations, such as stacked, non-stacked, or both.

The second substrate 1210 has second top contacts 1262, such as contact pads or terminal pads, exposed at the second top surface 1260 for further connections, such as connections for the second interconnects 1258. The second bridge interconnects 1274 connect to a predetermined portion of the second top contacts 1262. Second bottom contacts 1264, such as contact pads or terminal pads, are exposed at a second bottom surface 1266 for connections with second external interconnects 1268, such as solder balls. The second substrate 1210 may have a similar or substantially the same type of structures as the bridge substrate 1224.

For illustrative purposes, the second substrate 1210 is shown as a two layer substrate, although it is understood that the second substrate 1210 may not be a two layer substrate. Also for illustrative purposes, the second integrated circuit package system 1216 is shown having the second external interconnects 1268, although it is understood that the second integrated circuit package system 1216 may not have the second external interconnects 1268.

Figure 13:
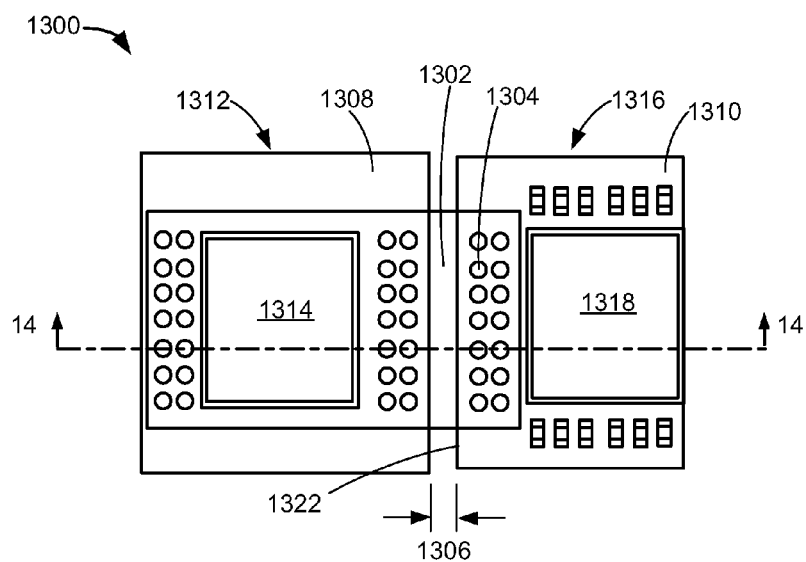
FIG. 13 is a plan view of a bridge stack integrated circuit package-on-package system in yet another alternative embodiment of the present invention.

Referring now to FIG. 13, therein is shown a plan view of a bridge stack integrated circuit package-on-package system 1300 in yet another alternative embodiment of the present invention. The plan view depicts a bridge integrated circuit package system 1302 having bridge interconnects 1304, such as solder balls, solder paste, or conductive adhesive.

The bridge integrated circuit package system 1302 functions as a bridge over a separation 1306 between a first substrate 1308, such as a laminate substrate, a lead frame, a printed circuit board, or a carrier, and a second substrate 1310, such as a laminate substrate, a lead frame, a printed circuit board, or a carrier.

A first integrated circuit package system 1312, such as an integrated circuit package system, includes a first encapsulation 1314, such as an epoxy mold compound or glob top, over the first substrate 1308. A second integrated circuit package system 1316, such as an integrated circuit package system, includes the second substrate 1310 and a second encapsulation 1318, such as an epoxy mold compound or glob top, over the second substrate 1310. The second encapsulation 1318 is in an offset configuration from a side 1322 of the second substrate 1310. The offset configuration provides a larger continuous connection area for the bridge interconnects 1304.

The bridge integrated circuit package system 1302 is stacked over the first encapsulation 1314. This configuration allows more connections of the bridge interconnects 1304 between the bridge integrated circuit package system 1302 and the first substrate 1308. For illustrative purposes, the bridge interconnects 1304 over the first substrate 1308 and the second substrate 1310 are shown substantially the same, although it is understood that the bridge interconnects 1304 over the first substrate 1308 and the second substrate 1310 may be different, such as different types.

Figure 14:
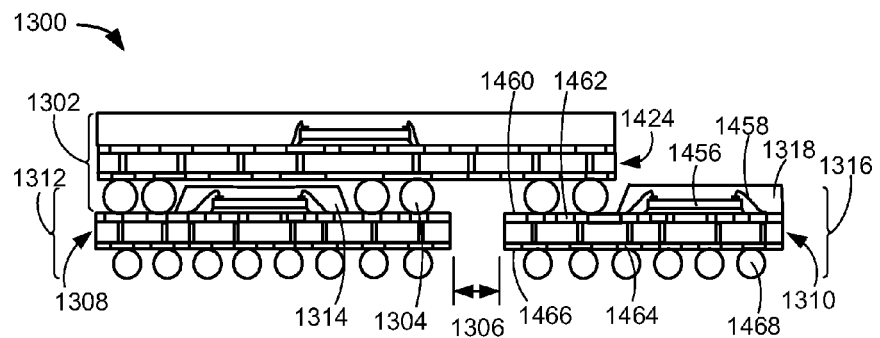
FIG. 14 is a cross-sectional view of the bridge stack integrated circuit package-on-package system along a line segment 14-14 of FIG. 13 in yet another embodiment of the present invention.

Referring now to FIG. 14, therein is shown a cross-sectional view of the bridge stack integrated circuit package-on-package system 1300 along a line segment 14—14 of FIG. 13 in yet another embodiment of the present invention. The cross-sectional view depicts the bridge integrated circuit package system 1302 connecting the first substrate 1308 of the first integrated circuit package system 1312 and the second substrate 1310 of the second integrated circuit package system 1316. The bridge integrated circuit package system 1302 is over the separation 1306 between the first integrated circuit package system 1312 and the second integrated circuit package system 1316.

The first integrated circuit package system 1312 may be similar or substantially the same in structure as the first integrated circuit package system 1012 of FIG. 11. For brevity, the first integrated circuit package system 1312 will be viewed substantially the same as the first integrated circuit package system 1012 of FIG. 11. Although it is understood that the first integrated circuit package system 1312 may be different from the first integrated circuit package system 1012 of FIG. 11.

The bridge integrated circuit package system 1302 is stacked over the first encapsulation 1314. The cross-sectional view depicts the bridge interconnects 1304 on both sides of the first encapsulation 1314 over the first substrate 1308. The bridge interconnects 1304 are also over the second substrate 1310.

The bridge integrated circuit package system 1302 may be similar or substantially the same in structure as the bridge integrated circuit package system 1002 of FIG. 11. For brevity, the bridge integrated circuit package system 1302 will be viewed substantially the same as the bridge integrated circuit package system 1002 of FIG. 11. Although it is understood that the bridge integrated circuit package system 1302 may be different from the bridge integrated circuit package system 1002 of FIG. 11.

The second integrated circuit package system 1316 has the second encapsulation 1318 in an offset configuration over the second substrate 1310. The second integrated circuit package system 1316 has a second integrated circuit die 1456 also in the offset configuration over the second substrate 1310. Second interconnects 1458, such as bond wires, connect the second integrated circuit die 1456 and the second substrate 1310. The second encapsulation 1318, such as an epoxy mold compound, covers the second integrated circuit die 1456, the second interconnects 1458, and a portion of a second top surface 1460 of the second substrate 1310.

For illustrative purposes, the second integrated circuit die 1456 is shown as a wire bond chip, although it is understood that the second integrated circuit die 1456 may be a different type of chip, such as a flip chip. Also for illustrative purposes, the second integrated circuit die 1456 is shown as a single die, although it is understood that the second integrated circuit die 1456 may represent a different number of dice in different configurations, such as stacked, non-stacked, or both.

The second substrate 1310 has second top contacts 1462, such as contact pads or terminal pads, exposed at the second top surface 1460 for further connections, such as connections for the second interconnects 1458. The bridge interconnects 1304 connect to a predetermined portion of the second top contacts 1462. Second bottom contacts 1464, such as contact pads or terminal pads, are exposed at a second bottom surface 1466 for connections with second external interconnects 1468, such as solder balls. The second substrate 1310 may have a similar or substantially the same type of structures as a bridge substrate 1424.

For illustrative purposes, the second substrate 1310 is shown as a two layer substrate, although it is understood that the second substrate 1310 may not be a two layer substrate. Also for illustrative purposes, the second integrated circuit package system 1316 is shown having the second external interconnects 1468, although it is understood that the second integrated circuit package system 1316 may not have the second external interconnects 1468.

Figure 15:
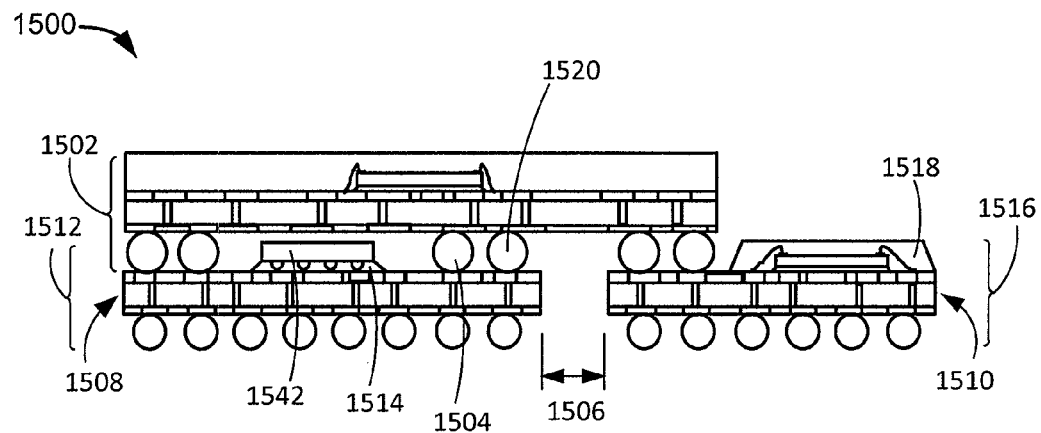
FIG. 15 is a cross-sectional view of a bridge stack integrated circuit package-on-package system along a line segment 14-14 of FIG. 13 in yet another embodiment of the present invention.

Referring now to FIG. 15, therein is shown a cross-sectional view of a bridge stack integrated circuit package-on-package system 1500 along a line segment 14—14 of FIG. 13 in yet another embodiment of the present invention. The plan view of FIG. 13 may represent the bridge stack integrated circuit package-on-package system 1500. The cross-sectional view depicts a bridge integrated circuit package system 1502 connecting a first substrate 1508 of a first integrated circuit package system 1512 and a second substrate 1510 of a second integrated circuit package system 1516. The bridge integrated circuit package system 1502 is over a separation 1506 between the first integrated circuit package system 1512 and the second integrated circuit package system 1516.

The first integrated circuit package system 1512 may be similar or substantially the same in structure as the first integrated circuit package system 1312 of FIG. 14. For brevity, the first integrated circuit package system 1512 will be viewed substantially the same as the first integrated circuit package system 1312 of FIG. 14 without the first encapsulation 1314 of FIG. 14. Although it is understood that the first integrated circuit package system 1512 may be different from the first integrated circuit package system 1312 of FIG. 14. The first integrated circuit package system 1512 has a first integrated circuit die 1542 as a flip chip.

The bridge integrated circuit package system 1502 is stacked over the first integrated circuit package system 1512. The cross-sectional view depicts bridge interconnects 1504 on both sides of the first integrated circuit die 1542 over the first substrate 1508. The bridge interconnects 1504 are also over the second substrate 1510. The bridge integrated circuit package system 1502 is connected to the first substrate 1508 and to the second substrate 1510 with the bridge interconnects 1504. The bridge interconnects 1504 adjacent to the separation border the separation 1506 without any structures therebetween.

The bridge integrated circuit package system 1502 may be similar or substantially the same in structure as the bridge integrated circuit package system 1302 of FIG. 14. For brevity, the bridge integrated circuit package system 1502 will be viewed substantially the same as the bridge integrated circuit package system 1302 of FIG. 14. Although it is understood that the bridge integrated circuit package system 1502 may be different from the bridge integrated circuit package system 1302 of FIG. 14.

The second integrated circuit package system 1516 has a second encapsulation 1518 in an offset configuration over the second substrate 1510 and may be similar or substantially the same in structure as the second integrated circuit package system 1316 of FIG. 14. For brevity, the second integrated circuit package system 1516 will be viewed substantially the same as the second integrated circuit package system 1316 of FIG. 14 without the second encapsulation 1318 of FIG. 14. Although it is understood that the second integrated circuit package system 1516 may be different from the second integrated circuit package system 1316 of FIG. 14.

Figure 16:
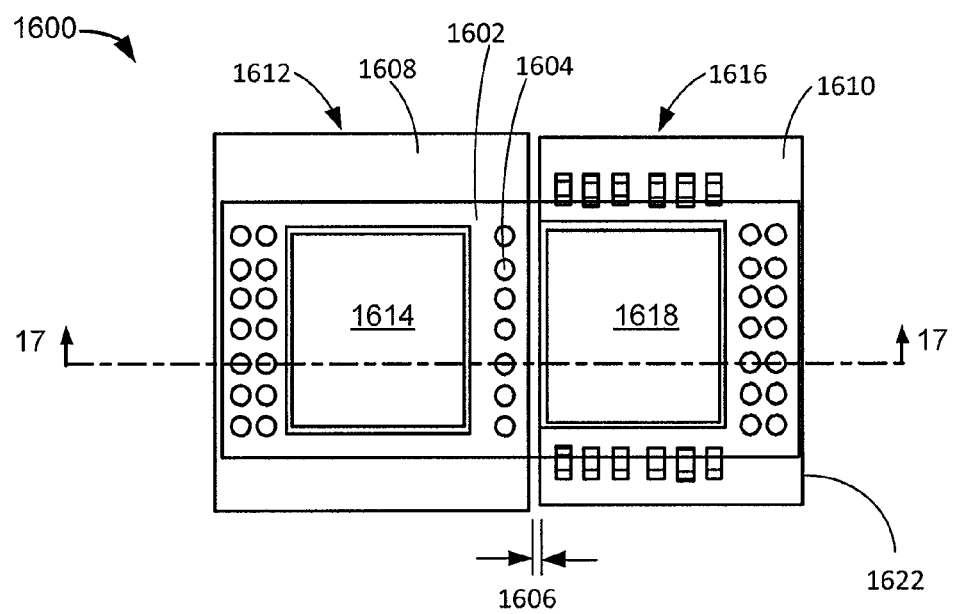
FIG. 16 is a plan view of a bridge stack integrated circuit package-on-package system in yet another alternative embodiment of the present invention.

Referring now to FIG. 16, therein is shown a plan view of a bridge stack integrated circuit package-on-package system 1600 in yet another alternative embodiment of the present invention. The plan view depicts a bridge integrated circuit package system 1602 having bridge interconnects 1604, such as solder balls, solder paste, or conductive adhesive.

The bridge integrated circuit package system 1602 functions as a bridge over a separation 1606 between a first substrate 1608, such as a laminate substrate, a lead frame, a printed circuit board, or a carrier, and a second substrate 1610, such as a laminate substrate, a lead frame, a printed circuit board, or a carrier. The bridge integrated circuit package system 1602 may also provide routing paths (not shown) for signal transmissions (not shown) of the first substrate 1608.

A first integrated circuit package system 1612, such as an integrated circuit package system, includes a first encapsulation 1614, such as an epoxy mold compound or glob top, over the first substrate 1608. A second integrated circuit package system 1616, such as an integrated circuit package system, includes the second substrate 1610 and a second encapsulation 1618, such as an epoxy mold compound or glob top, over the second substrate 1610. The second encapsulation 1618 is in an offset configuration from a side 1622 of the second substrate 1610. The offset configuration provides a larger continuous connection area for the bridge interconnects 1604.

The bridge integrated circuit package system 1602 is stacked over the first integrated circuit package system 1612 and the second integrated circuit package system 1616. This configuration allows more connections of the bridge interconnects 1604 between the bridge integrated circuit package system 1602 and the first substrate 1608. The offset configuration also allows for connections of the bridge interconnects 1604 between the bridge integrated circuit package system 1602 and the second substrate 1610 while minimizing the lateral dimension for the bridge stack integrated circuit package-on-package system 1600. For illustrative purposes, the bridge interconnects 1604 over the first substrate 1608 and the second substrate 1610 are shown substantially the same, although it is understood that the bridge interconnects 1604 over the first substrate 1608 and the second substrate 1610 may be different, such as different types.

Figure 17:
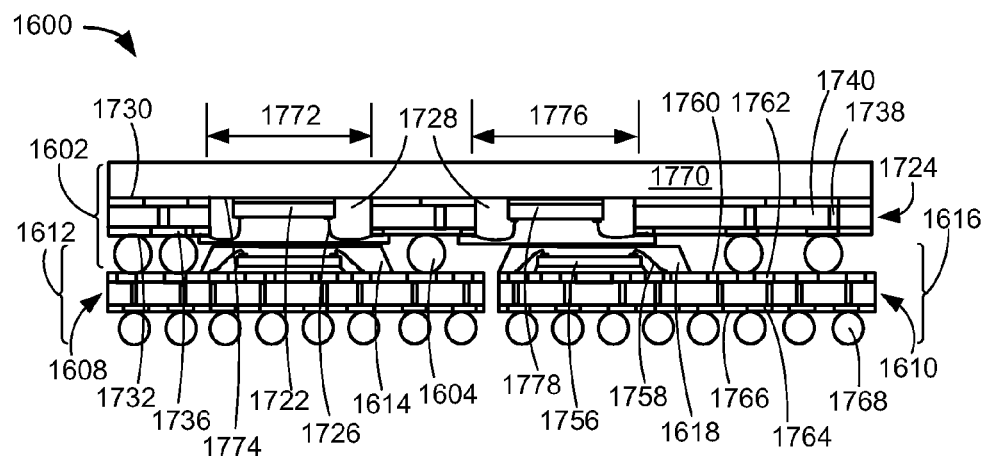
FIG. 17 is a cross-sectional view of the bridge stack integrated circuit package-on-package system along a line segment 17-17 of FIG. 16.

Referring now to FIG. 17, therein is shown a cross-sectional view of the bridge stack integrated circuit package-on-package system 1600 along a line segment 17—17 of FIG. 16. The bridge stack integrated circuit package-on-package system 1600 has the bridge integrated circuit package system 1602, the first integrated circuit package system 1612, and the second integrated circuit package system 1616. The first integrated circuit package system 1612 may be similar or substantially the same in structure as the first integrated circuit package system 1212 of FIG. 12.

For brevity, the first integrated circuit package system 1612 will be viewed substantially the same as the first integrated circuit package system 1312 of FIG. 14. Although it is understood that the first integrated circuit package system may be different from the first integrated circuit package system 1312 of FIG. 14.

The bridge integrated circuit package system 1602 has a planar structure 1770, such as a stiffener for planar rigidity, a heat spreader, or an electromagnetic interference (EMI) shield, over a bridge top surface 1730 of a bridge substrate 1724, such as a laminate substrate. The planar structure 1770 is also over a first opening 1772 of the bridge substrate 1724 and a second opening 1776 of the bridge substrate 1724.

A first bridge integrated circuit die 1722 is in the first opening 1772 and attaches to a structure bottom surface 1774 of the planar structure 1770. A second bridge integrated circuit die 1778 is in the second opening 1776 and attaches to the structure bottom surface 1774 of the planar structure 1770. Internal interconnects 1726, such as bond wires, connect the first bridge integrated circuit die 1722 and the second bridge integrated circuit die 1778 to a bridge bottom surface 1732 of the bridge substrate 1724 with a board on chip (BOC) configuration.

A package encapsulation 1728, such as an epoxy mold compound, covers the first bridge integrated circuit die 1722, the second bridge integrated circuit die 1778, and the internal interconnects 1726. The package encapsulation 1728 also fills the first opening 1772 and the second opening 1776. The package encapsulation 1728 in the first opening 1772 is above the first encapsulation 1614. The package encapsulation 1728 in the second opening 1776 is above the second encapsulation 1618.

The bridge interconnects 1604 attach to the bridge bottom surface 1732 of the bridge substrate 1724. For illustrative purposes, the first bridge integrated circuit die 1722 and the second bridge integrated circuit die 1778 are each shown as a single die, although it is understood that the first bridge integrated circuit die 1722 and the second bridge integrated circuit die 1778 each may represent more than one die in different configurations, such as stacked, non-stacked, or both.

Bridge bottom contacts 1736, such as contact pads or terminal pads, are exposed at the bridge bottom surface 1732. The bridge interconnects 1604 attach between the bridge bottom contacts 1736 and the first substrate 1608 of the first integrated circuit package system 1612 as well as between the bridge bottom contacts 1736 and the second substrate 1610 of the second integrated circuit package system 1616.

Interlayer connects 1738, such as electrical vias, may connect a predetermined selection of the bridge bottom contacts 1736 to each other and to other routing traces (not shown) of the bridge substrate 1724 at different trace layers (not shown) of the bridge substrate 1724. An insulator 1740, such as a dielectric, electrically isolates the bridge bottom contacts 1736 and the interlayer connects 1738 from each other. For illustrative purposes, the bridge substrate 1724 is shown as a two layer substrate, although it is understood that the bridge substrate 1724 may not be a two layer substrate.

The bridge substrate 1724 may serve multiple functions, such as providing planar rigidity for the bridge integrated circuit package system 1602, and providing electrical transmission paths between the first bridge integrated circuit die 1722 and the bridge interconnects 1604. The bridge substrate 1724 may also provide electrical transmission paths between the second bridge integrated circuit die 1778 and the bridge interconnects 1604.

The bridge substrate 1724 may also serve as a redistribution structure for the routing traces (not shown) of different trace layers (not shown). The routing traces may be connected by a predetermined selection of the interlayer connects 1738. The bridge substrate 1724 and the bridge interconnects 1604 may bridge transmission within the first substrate 1608, within the second substrate 1610, and between the first substrate 1608 and the second substrate 1610 without communication with the first bridge integrated circuit die 1722 or the second bridge integrated circuit die 1778.

The first bridge integrated circuit die 1722 and the second bridge integrated circuit die 1778 may interact, such as buffer signal strength, change protocol, or translate signal modulation, with signals transmitted between the first integrated circuit package system 1612 and the second integrated circuit package system 1616. The first bridge integrated circuit die 1722 and the second bridge integrated circuit die 1778 may function as a pass or block gate for transmission.

The second integrated circuit package system 1616 has a second integrated circuit die 1756 also in the offset configuration over the second substrate 1610. Second interconnects 1758, such as bond wires, connect the second integrated circuit die 1756 and the second substrate 1610. The second encapsulation 1618, such as an epoxy mold compound, covers the second integrated circuit die 1756, the second interconnects 1758, and a second top surface 1760 of the second substrate 1610.

For illustrative purposes, the second integrated circuit die 1756 is shown as a wire bond chip, although it is understood that the second integrated circuit die 1756 may be a different type of chip, such as a flip chip. Also for illustrative purposes, the second integrated circuit die 1756 is shown as a single die, although it is understood that the second integrated circuit die 1756 may represent a different number of dice in different configurations, such as stacked, non-stacked, or both.

The second substrate 1610 has second top contacts 1762, such as contact pads or terminal pads, exposed at the second top surface 1760 for further connections, such as connections for the second interconnects 1758. The bridge interconnects 1604 connect to a predetermined portion of the second top contacts 1762. Second bottom contacts 1764, such as contact pads or terminal pads, are exposed at a second bottom surface 1766 for connections with second external interconnects 1768, such as solder balls. The second substrate 1610 may have a similar or substantially the same type of structures as the bridge substrate 1724.

For illustrative purposes, the second substrate 1610 is shown as a two layer substrate, although it is understood that the second substrate 1610 may not be a two layer substrate. Also for illustrative purposes, the second integrated circuit package system 1616 is shown having the second external interconnects 1768, although it is understood that the second integrated circuit package system 1616 may not have the second external interconnects 1768.

Figure 18:
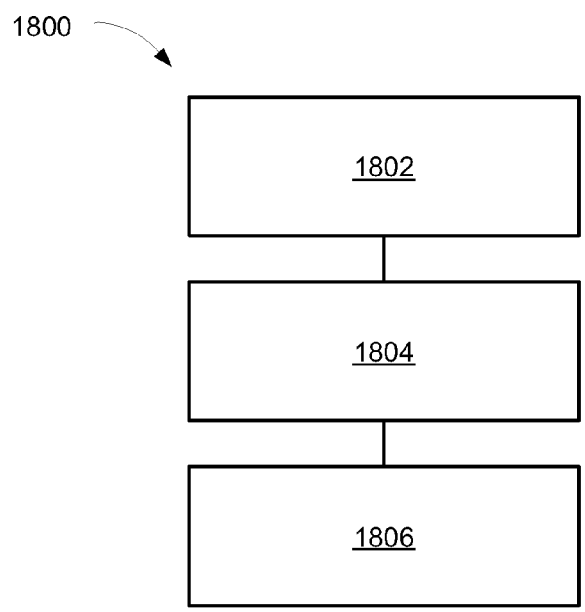
FIG. 18 is a flow chart of a bridge stack integrated circuit package-on-package system for manufacture of the bridge stack integrated circuit package-on-package system in an embodiment of the present invention.

Referring now to FIG. 18, therein is shown a flow chart of a bridge stack integrated circuit package-on-package system 1800 for manufacture of the bridge stack integrated circuit package-on-package system 100 in an embodiment of the present invention. The system 1800 includes forming a first integrated circuit package system having a first substrate in a block 1802; forming a second integrated circuit package system having a second substrate in a block 1804; and mounting a bridge integrated circuit package system on the first substrate and on the second substrate in a block 1806.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the bridge stack integrated circuit package-on-package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacturing a bridge stack integrated circuit package-on-package system comprising:
   forming a first integrated circuit package system having a first integrated circuit die over a first substrate;
   forming a second integrated circuit package system having a second integrated circuit die over a second substrate;
   forming a bridge integrated circuit package system having a bridge interconnect; and
   mounting the bridge integrated circuit package system on the first substrate and on the second substrate and directly attaching the bridge interconnect to the first substrate and an another bridge interconnect to the second substrate, the bridge integrated circuit package system and the bridge interconnect and the another bridge interconnect border a separation and have no structures therebetween, and the separation is between the first integrated circuit package system and the second integrated circuit package system.

2. The method as claimed in claim 1 wherein mounting the bridge integrated circuit package system includes overhanging the bridge integrated circuit package system over the first integrated circuit package system.

3. The method as claimed in claim 1 wherein mounting the bridge integrated circuit package system on the first substrate includes mounting the bridge integrated circuit package system over the first integrated circuit package system.

4. The method as claimed in claim 1 wherein forming the first integrated circuit package system includes attaching a first external interconnect on a first bottom contact of the first substrate.

5. The method as claimed in claim 1 wherein forming the bridge integrated circuit package system includes forming a package encapsulation.

6. A bridge stack integrated circuit package-on-package system comprising:
   a first integrated circuit package system having a first integrated circuit die over a first substrate;
   a second integrated circuit package system having a second integrated circuit die over a second substrate; and
   a bridge integrated circuit package system on the first substrate and on the second substrate includes a bridge interconnect attached directly to the first substrate and an another bridge interconnect attached directly to the second substrate, the bridge interconnect and the another bridge interconnect border a separation and have no structures therebetween, and the separation is between the first integrated circuit package system and the second integrated circuit package system.

7. The system as claimed in claim 6 wherein the first integrated circuit package system includes a first encapsulation over the first substrate in an offset configuration.

8. The system as claimed in claim 6 wherein the bridge integrated circuit package system includes a first bridge interconnect with a first height and a second bridge interconnect with a second height such that the second height is not equal to the first height.

9. The system as claimed in claim 6 wherein the bridge integrated circuit package system includes:
   a bridge substrate having an opening; and
   a planar structure over the bridge substrate.

10. The system as claimed in claim 6 wherein the first integrated circuit package system includes a flip chip over the first substrate.

11. The system as claimed in claim 6 wherein the bridge integrated circuit package system includes a first overhang over the first integrated circuit package system.

12. The system as claimed in claim 6 wherein the bridge integrated circuit package system on the first substrate includes the bridge integrated circuit package system over the first integrated circuit package system.

13. The system as claimed in claim 6 wherein the first integrated circuit package system includes a first external interconnect on a first bottom contact of the first substrate.

14. The system as claimed in claim 6 wherein the bridge integrated circuit package system includes a package encapsulation.

* * * * *